United States Patent [19]

Kim et al.

[11] Patent Number: 5,652,187
[45] Date of Patent: Jul. 29, 1997

[54] METHOD FOR FABRICATING DOPED INTERLAYER-DIELECTRIC FILM OF SEMICONDUCTOR DEVICE USING A PLASMA TREATMENT

[75] Inventors: Changgyu Kim; Changki Hong; Uin Chung, all of Suwon; Yongchul Ahn, Kyungki-do, all of Rep. of Korea

[73] Assignee: Samsung Electronics Co., Ltd., Kyungki-do, Rep. of Korea

[21] Appl. No.: 190,619

[22] Filed: Feb. 1, 1994

Related U.S. Application Data

[63] Continuation-in-part of Ser. No. 969,582, Oct. 30, 1992, Pat. No. 5,405,489.

[30] Foreign Application Priority Data

Oct. 30, 1991 [KR] Rep. of Korea ............... 91-19176

[51] Int. Cl.⁶ .................... H01L 21/31; H01L 21/316
[52] U.S. Cl. .............................. 437/240; 437/982
[58] Field of Search .......................... 437/225, 228, 437/240, 982

[56] References Cited

U.S. PATENT DOCUMENTS

| | | | |
|---|---|---|---|
| 4,746,219 | 5/1988 | Haloway et al. | 357/23.11 |
| 4,799,992 | 1/1989 | Rao et al. | 156/643 |
| 4,872,947 | 10/1989 | Wang et al. | 156/643 |
| 5,376,591 | 12/1994 | Maeda et al. | 437/238 |
| 5,405,489 | 4/1995 | Kim et al. | 156/643 |

FOREIGN PATENT DOCUMENTS

| | | | |
|---|---|---|---|
| 55-113335 | 9/1980 | Japan . | |
| 63-086426 | 8/1988 | Japan . | |
| 1238147 | 9/1989 | Japan | H01L 21/90 |
| 21081952 | 7/1990 | Japan . | |

OTHER PUBLICATIONS

Yasuo Ikeda, Youichirou Numasawa and Mitsuru Sakamoto; Ozone/Organic–Source APCVD . . . Films; Development Div.; NEC Res. & Dev. No. 84 (Jul. 1969).

D.S. Williams E.A. Dein; "LPCVD of BPSG from Org. Reactants;" J. Electrochemical Soc. Solid–State Science & Tech.; Mar. 1987, pp. 57–63.

Peter Lee, Maria Galiano, Peter Keswick, Jerry Wong, Bok Shin, David Wang; "Sub APCVD (SACVD) of Teos–$O_3$ OSG & BPSG"; Th–0325–Jan. 1990 0000–0398C 1990 IEEE.

*Primary Examiner*—R. Bruce Breneman
*Assistant Examiner*—Matthew Whipple
*Attorney, Agent, or Firm*—Cushman, Darby & Cushman, L.L.P

[57] ABSTRACT

The surface of a borophosphosilicate glass (BPSG) dielectric film undergoes a surface treatment, such as by plasma treatment with $N_2O$, $N_2+NH_3$, $N_2$, $O_2$ or $O_3$. Erosion caused by $H_2SO_4$ boiling or by humidity absorption from the atmosphere is thereby reduced so that reflow processing at temperatures ideally below 850° C. is possible and an interlayer dielectric film of excellent planarity is thus formed.

6 Claims, 7 Drawing Sheets

FIG. IA
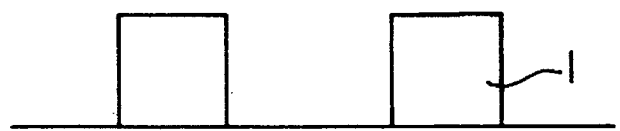
FIG. IB
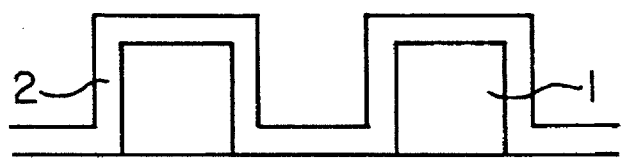
FIG. IC
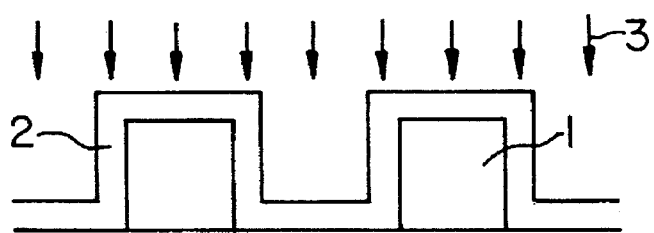
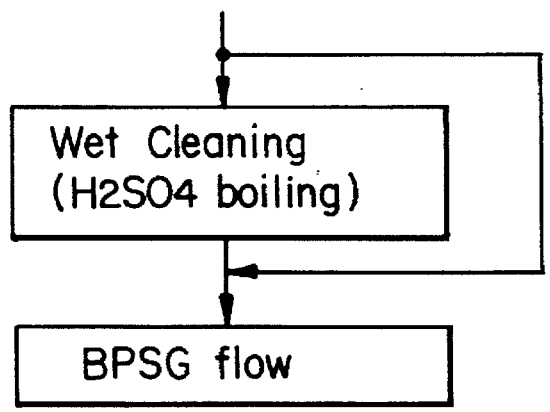

FIG. 2A
(PRIOR ART)
FIG. 2B
(PRIOR ART)
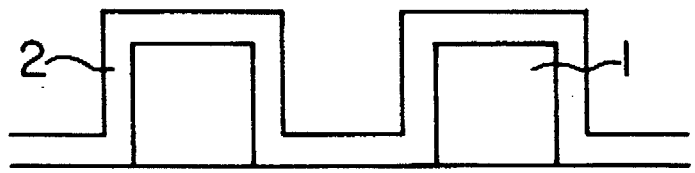
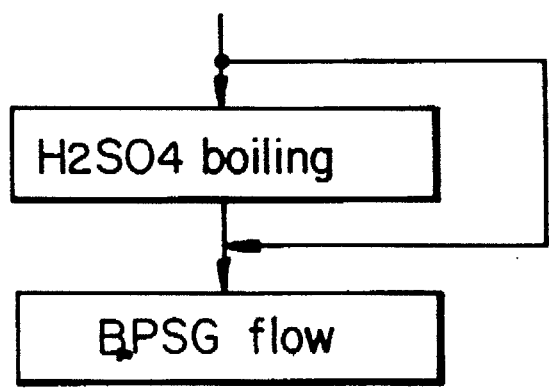

METHOD FOR FABRICATING DOPED INTERLAYER-DIELECTRIC FILM OF SEMICONDUCTOR DEVICE USING A PLASMA TREATMENT

This application is a CIP of U.S. Ser. No. 07/969,582 filed Oct. 30, 1992, now U.S. Pat. No. 5,405,489. The parent application is based on Korean Application No. 91-19176, filed on Oct. 30, 1991, the contents of which are incorporated herein by reference.

BACKGROUND OF THE INVENTION

1. The Field of the Invention

The present invention relates to a method for fabricating an interlayer dielectric film for a semiconductor device. Particularly, it relates to a method for fabricating an interlayer dielectric film for a semiconductor device capable of 1) overcoming functional limitations on borophosphosilicate concentrations in the film and 2) reducing erosion due to $H_2SO_4$ boiling. This is accomplished by performing a surface treatment on a borophosphosilicate glass film after the deposition thereof onto a semiconductor substrate.

2. Description of Prior Art

Some very large scale integration (VLSI) processes would benefit from being performed at lower temperatures than those necessary for phosphosilicate glass (PSG) reflow (1,000°–1,100° C.) because such high temperatures result in excessive diffusion of junctions. Furthermore, metal oxide semiconductor gate oxides cannot be exposed to high temperature processing (i.e. beyond 900° C.). However, flowable glass is still very desirable for facilitating film coverage over abrupt steps in the substrate topography. Glass flow temperatures as low as 700° C. can be obtained by adding boron dopant (e.g. $B_2H_6$) to the PSG gas flow to form the ternary (three component) oxide system $B_2O_3$—$P_2O_5$—$SiO_2$, borophosphosilicate glass (BPSG).

BPSG flow depends on film composition, flow temperature, flow time, and flow ambient atmosphere. Reportedly, an increase in boron concentration of 1 wt % in BPSG decreases the required flow temperature by about 40° C. However, increasing the P concentration beyond about 5 wt % does not further decrease BPSG flow temperature. Furthermore, there is an upper limit on boron concentration imposed by film stability. That is, BPSG films containing over 5 wt % boron tend to be very hygroscopic and unstable, and if used, should be flowed immediately following deposition. It has also been reported that rapid thermal annealing for 30 seconds at a temperature 100°–175° C. higher than that used in a conventional furnace step will result in equivalent BPSG flow. The ambient gas of the flow cycle also affects the flow mechanism. By using a steam ambient instead of $N_2$, the minimum required flow temperature is reduced by about 70° C.

In addition to exhibiting these low temperature flow properties, BPSG (like PSG) is an alkali ion getter and exhibits low stress. Because of its doping, however, BPSG can also be an unwanted diffusion source to underlying silicon. It is found that BPSG is primarily a source of phosphorus, and phosphorus outdiffusion is increased at higher boron concentrations.

Because of the BPSG characteristics mentioned above, atmospheric pressure chemical vapor deposition (APCVD) using $O_3$ and organic-source has been recently used. This example is disclosed at page 6 of the Ozone/Organic-Source APCVD for ULSI Reflow Glass Films, by Yasuo IKEDA, Youichirou NUMASAWA and Mitsuru SAKAMOTO, VLSI Development Division, NEC Res. & Develop. No. 94, published in July, 1987.

When BPSG used as an interlayer dielectric film becomes submicron, BPSG reflow causes junction breakdown due to thermal stress, so low temperature reflow processing is desirable. According to conventional process technology, planarization of interlayer dielectrics (ILD) is accomplished by carrying out $H_2SO_4$ boiling, then BPSG reflow for deposition. FIGS. 2A and 2B show processing flow diagrams according to a conventional art technology. FIG. 2A depicts a pattern where a conductor 1 is formed and FIG. 2B depicts that BPSG 2 is deposited on the conductor 1. After BPSG with high concentrations of B and P (i.e., from 4 to 15 wt % of both B and P) is deposited, $H_2SO_4$ boiling is carried out together with a surface treatment, and BPSG is then flowed. As the manufacture of from 1M bit DRAMs to 64M bit DRAMs has been achieved, BPSG low temperature reflow under 850° C. is required.

The outer-shell electron configuration of B or P in BPSG is different from that of silicon ions. As the number of outer-shell electrons for B and P is respectively changed from 3 to 4 and from 5 to 4, charge deficiency or increase in the oxygen ion occurs. As the network structure between atoms becomes weak, the melting point drops. As the concentration of B and P in the film increase, the melting point drops further because the network structure becomes weaker. However, in a case where BPSG films containing B and P in high concentrations are deposited, then are $H_2SO_4$ boiled without surface treatment, the films exhibit a significant tendency to crack. If BPSG films are left exposed in the air, they react with atmospheric humidity and crack. Thus, an expected benefit in using BPSG cannot be realized.

SUMMARY OF THE INVENTION

An object of the present invention is to solve the above-mentioned conventional disadvantages by providing a method for fabricating an interlayer dielectric film for a semiconductor device which is capable of avoiding exterior stress resulting from $H_2SO_4$ boiling or absorption of atmospheric humidity.

Another object of the present invention is to provide a method for fabricating an interlayer dielectric film for a semiconductor device which has good flow properties at low temperatures without being susceptible to cracking or bursting, by preventing BPSG from undergoing stress due to high concentrations of B and P.

In order to achieve the above objects, the present invention provides a method for fabricating an interlayer dielectric film comprising the steps of:

preparing a semiconductor substrate having electrical elements thereon;

depositing a dielectric film containing boron and phosphorous in high concentrations on the substrate;

carrying out a surface treatment of the dielectric film through plasma treatment; and performing reflow at low temperatures.

In addition, a plasma source gas for the plasma treatment is preferably selected from among $N_2O$, $N_2+NH_3$, $N_2$, $O_2$ or $O_3$.

BRIEF DESCRIPTION OF THE DRAWINGS

The above and further objects, features and advantages of the present invention will become more apparent from the following detailed description of embodiments taken in conjunction with the accompanying drawings, wherein:

FIGS. 1A to 1C show processing flow diagrams according to the present invention;

FIGS. 2A and 2B show processing flow diagrams according to a conventional art technology;

FIGS. 3A, 4A, 5A, and 6A are side sectional views of FIGS. 3C, 4C, 5C and 6C, and FIGS. 3B, 4B, 5B and 6B are partial enlarged views of FIGS. 3A, 4A, 5A and 6A.

DESCRIPTION OF THE PREFERRED EMBODIMENTS

FIGS. 1A to 1C depict processing flow diagrams according to the present invention. FIG. 1A shows the formation of a conductor 1. FIG. 1B shows a borophosphosilicate glass (BPSG) film 2 deposited on the conductor 1. After deposition of BPSG (with concentrations of both B and P from 4 to 15 wt %), a surface treatment 3 is performed, as shown in FIG. 1C. Plasma treatment is customarily performed in such an surface treatment.

In order to attain the object of the present invention as mentioned above, $O_3$-Tetraethylorthosilicate (TEOS) BPSG is used under deposition conditions which may be as follows: TEOS—3 SLM; Trimethylborate (TMB)—40 mg; Trimethylphosphate (TMOP)—1.5 SLM; $O_3$ concentration—5%; $O_3+O_2$ flow—7.5 SLM; and temperature—420° C.

In a comparative test, four different $O_3$-TEOS BPSG films are deposited to a thickness of 6000 angstroms on four different polysilicon substrates under the conditions described above. Among them, one is $N_2O$ plasma treated according to the present invention, another is treated by a $N_2+NH_3$ plasma treatment, a third is treated by a $N_2$ plasma treatment and the last without surface treatment (FIGS. 2A to 2B). After that, the four patterns undergo $H_2SO_4$ boiling under identical conditions and then are flowed in a nitrogen ambient for 30 minutes at 850° C.

Figure 3A:
FIGS. 3A to 3C, 4A to 4C, and 5A to 5C show sectional views of SEM microphotographs after surface treatment according to the present invention.
Figure 3B:
Figure 3C:
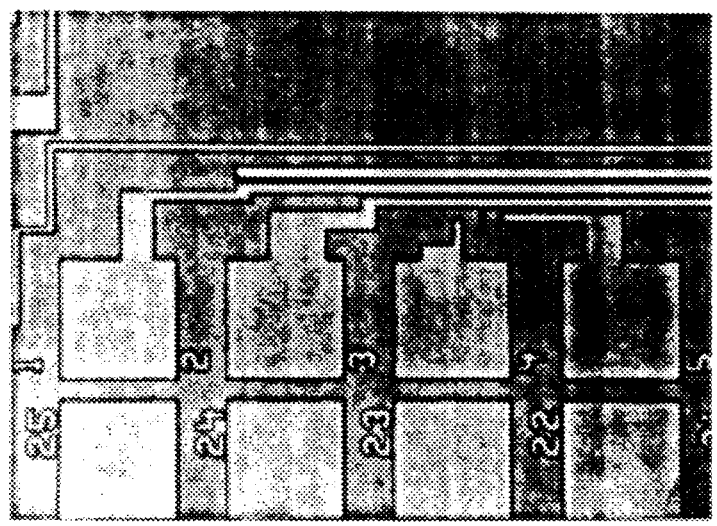

The pattern which underwent $N_2O$ plasma treatment according to the present invention shows no erosion from $H_2SO_4$ boiling and has good flow characteristics for achieving a desired level of planarity (refer to FIGS. 3A to 3C).

Figure 4A:
Figure 4B:
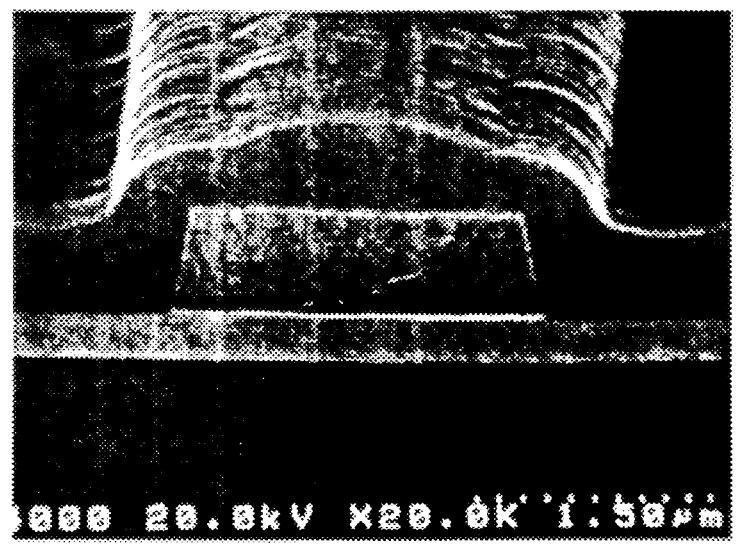
Figure 4C:
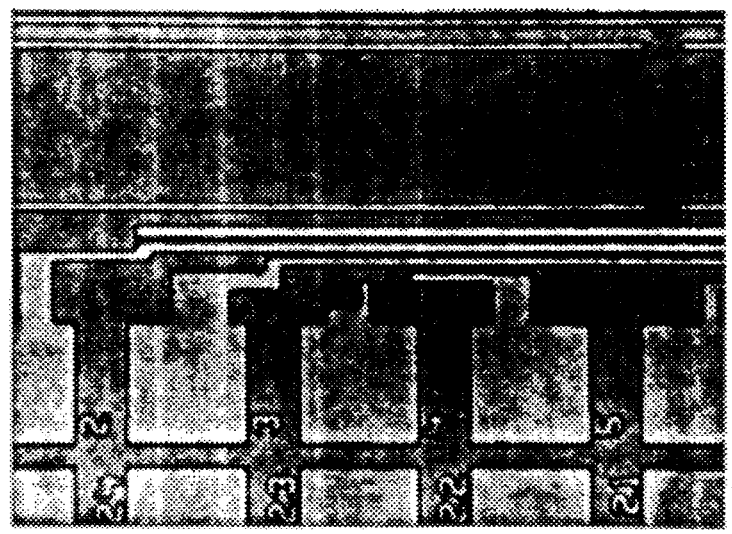

The pattern which underwent the $N_2+NH_3$ plasma treatment shows some erosion and its flow characteristics are not as good as that of the film treated by $N_2O$ plasma etching (FIGS. 4A to 4C).

Figure 5A:
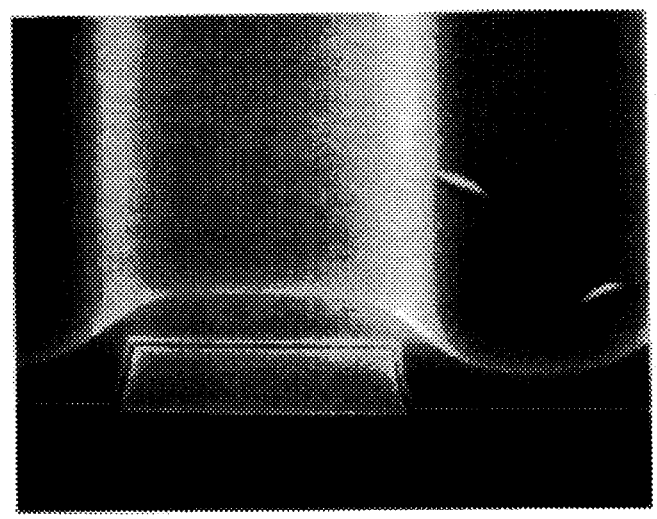
Figure 5B:
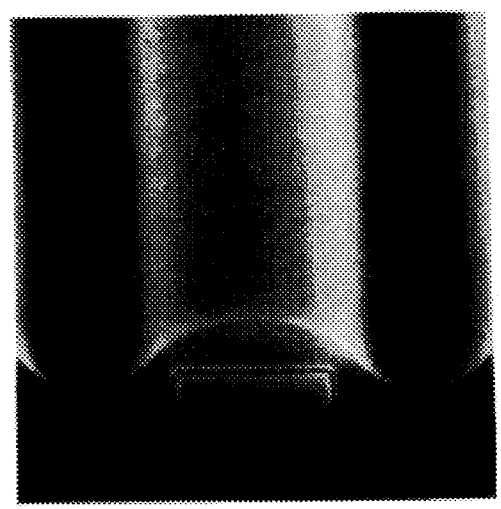
Figure 5C:
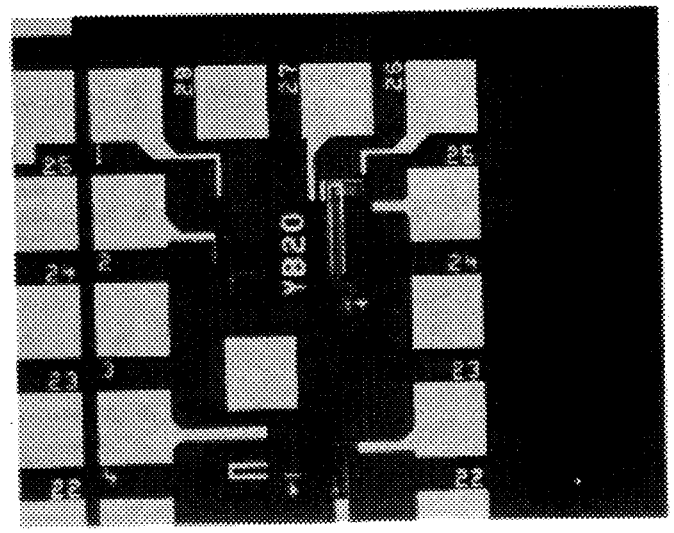

The pattern which underwent the $N_2$ plasma treatment shows no erosion from $H_2SO_4$ boiling and has the best flow characteristics for achieving a desired level of planarity (refer to FIGS. 5A to 5C).

Figure 6A:
FIGS. 6A to 6C show sectional views of SEM microphotographs according to a conventional art technology.
Figure 6B:
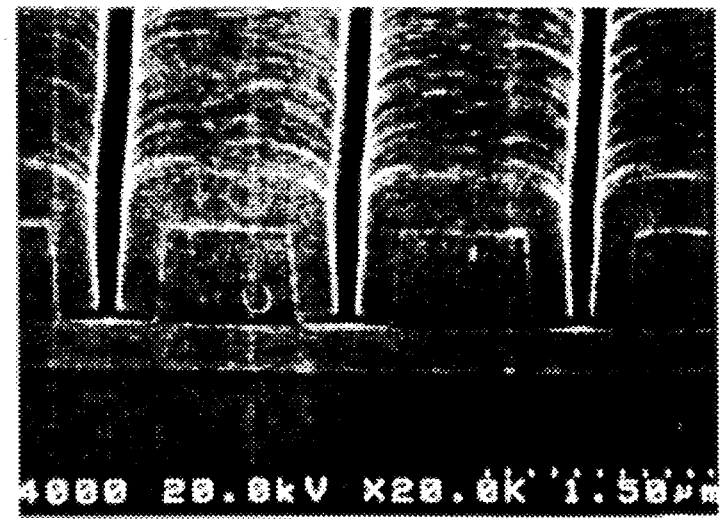
Figure 6C:
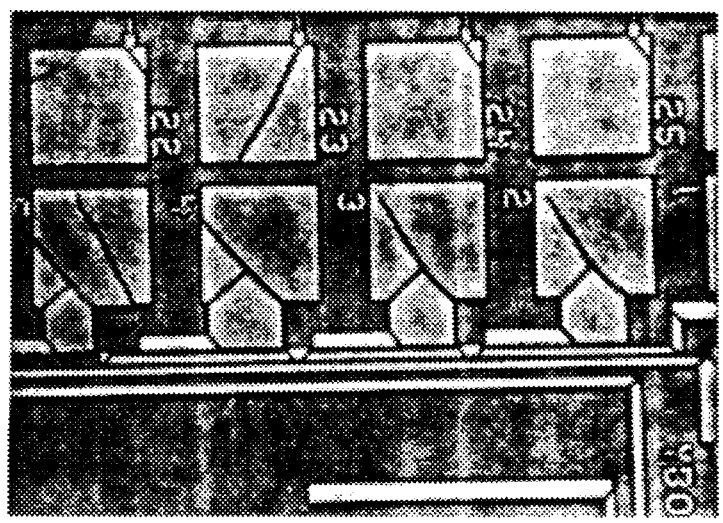

Finally, the BPSG pattern with high B and P concentration which was formed in the conventional manner without surface treatment shows severe cracks from $H_2SO_4$ boiling (FIGS. 6A to 6C).

The plasma treatment conditions of the above-described comparative test may be as follows: using a P-5000 Multichamber plasma apparatus; temperature ranging from 200° C. and typically 400° C.; RF power of 150 W; and the plasma source gas, $N_2O$, $N_2+NH_3$, and $N_2$, separately for five minutes. Even if these conditions change and the plasma source gas is substituted with $O_3$ or $O_2$, etc., characteristics similar to the above can be obtained. That is, unstable free $B_2O_3$ on the surface of the BPSG is processed by $N_2O$ or $O_2$ plasma process, thereby changing into a B—O—Si structure, or forming a new $SiO_x$ film.

Figure 7:
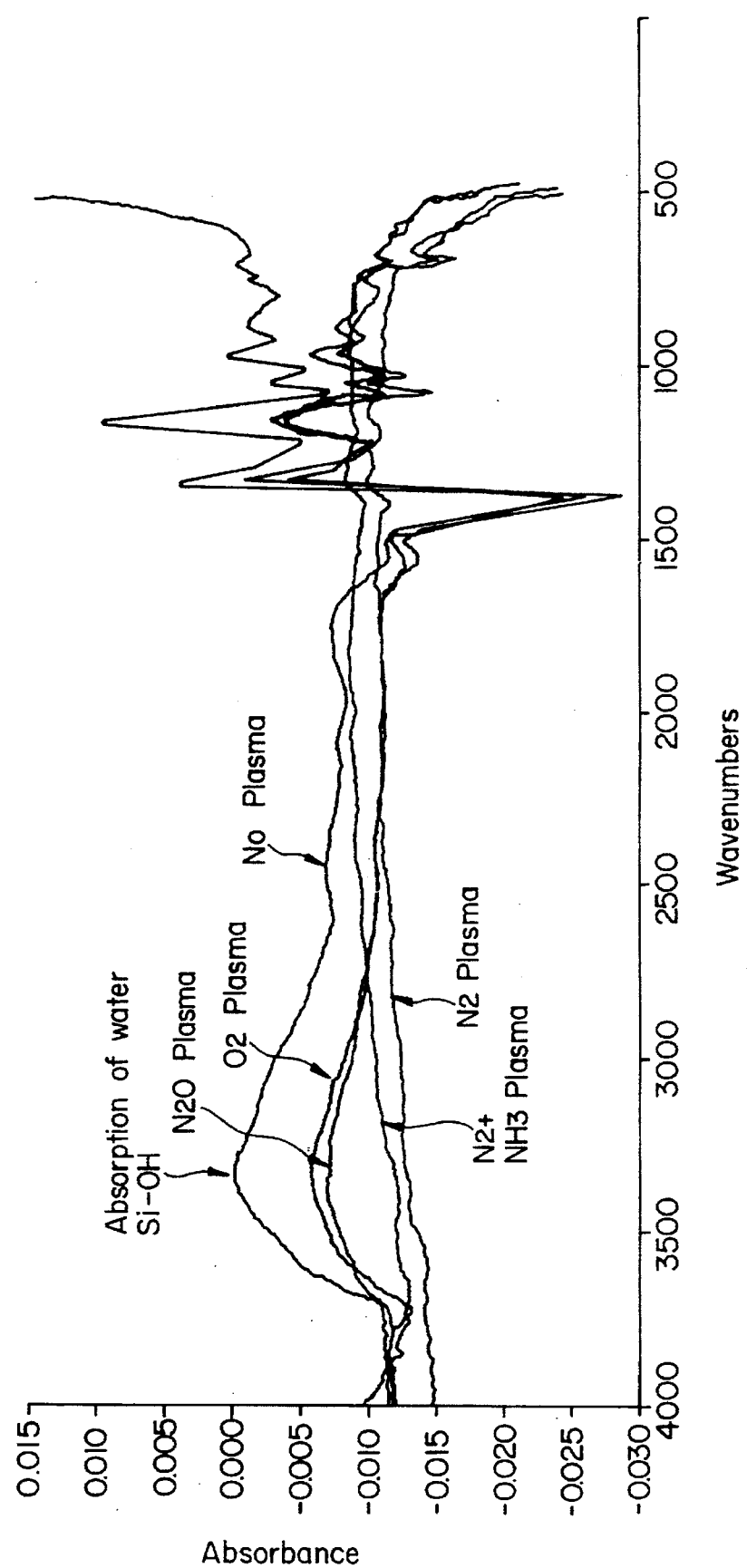
FIG. 7 shows FT-IR (Fourier Transform-Infra Red) data according to the present invention and a conventional art technology.

FIG. 7 depicts FT-IR data, in which the plasma source gases, $N_2O$, $N_2+NH_3$, $N_2$, and $O_2$ are used. In this picture, the horizontal axis represents the wave numbers and the vertical axis represents the absorbance. FIG. 7 shows the spectral peak of the case with no plasma treatment is remarkably high at 3380/Å. It is caused by high absorption of water. That the spectral peak is high at certain wavelength means that many vibrating bonds exist at the peak. But, in the cases of $N_2$, $N_2+NH_3$ plasma treatment, the spectral characteristic is stable.

In a case where BPSG is flowed for 30 minutes at a temperature 800° C. in a $N_2$ ambient, after surface treatment and $H_2SO_4$ boiling are carried out, the B and P spectrums are similar to spectrums of the deposition state. However, in a case where surface treatment is not performed according the present invention, the spectral peak of B is noticeably lower.

Shrinkage in the former case is significantly less than in the latter case (i.e., with surface treatment rather than without). Surface treatment according to the present invention after the deposition of BPSG can prevent erosion caused by humidity absorption and outdiffusion of boron such that excellent flow characteristics are achieved at reflow temperatures generally less than 850° C. In addition, problems such as junction breakdown from thermal stress can be reduced or eliminated because of the lower flow temperatures.

In summary, untreated BPSG with high B and P concentrations can be used in the same applications as those to which the present invention is directed. However, severe erosion caused by $H_2SO_4$ boiling or by humidity absorption from the atmosphere is very apparent, especially with increased B concentrations. Thus, there is effectively a limit on B and P concentrations. According to the present invention, however, BPSG having high B and P concentrations may be used in conjunction with a surface treatment thereof, such as a $N_2O$ or $N_2$ plasma process, so that low temperature flow can be performed while minimizing erosion and tendencies towards bursting or cracking.

What is claimed is:

1. A method for fabricating an interlayer dielectric film comprising the steps of:
    (a) preparing a semiconductor substrate having electrical elements thereon;
    (b) depositing a dielectric film containing boron and phosphorous over said electrical elements and said substrate;
    (c) surface treating said dielectric film using a plasma source gas consisting of $N_2$; and
    (d) reflowing said dielectric film using a temperature below about 850° C. after performing said surface treatment.

2. The method according to claim 1, wherein said dielectric film contains boron at concentrations ranging from 4 to 15 wt %.

3. The method according to claim 1, wherein said dielectric film contains phosphorous at concentrations ranging from 4 to 15 wt %.

4. The method according to claim 1, further including the step of wet cleaning the surface of the dielectric film prior to said reflowing step.

5. The method according to claim 4, wherein said wet cleaning step comprises performing $H_2SO_4$ boiling.

6. The method according to claim 1, wherein said step of preparing a semiconductor substrate includes forming electrical conductors on said substrate.

* * * * *